United States Patent
Parrish et al.

(10) Patent No.: US 11,432,442 B2
(45) Date of Patent: Aug. 30, 2022

(54) EMC SHIELD AND METHOD OF PRODUCING THE SAME

(71) Applicant: Interplex Industries, Inc., East Providence, RI (US)

(72) Inventors: Jeffrey D Parrish, Plymouth, MI (US); Gregory Torigian, Garnerville, NY (US); Anthony Miller, Northvale, NJ (US)

(73) Assignee: Interplex Industries, Inc., East Providence, RI (US)

( * ) Notice: Subject to any disclaimer, the term of this patent is extended or adjusted under 35 U.S.C. 154(b) by 0 days.

(21) Appl. No.: 17/281,170

(22) PCT Filed: Sep. 16, 2019

(86) PCT No.: PCT/US2019/051238
§ 371 (c)(1),
(2) Date: Mar. 29, 2021

(87) PCT Pub. No.: WO2020/072189
PCT Pub. Date: Apr. 9, 2020

(65) Prior Publication Data
US 2021/0345530 A1    Nov. 4, 2021

Related U.S. Application Data

(60) Provisional application No. 62/740,537, filed on Oct. 3, 2018.

(51) Int. Cl.
*H05K 9/00*    (2006.01)

(52) U.S. Cl.
CPC ......... *H05K 9/0026* (2013.01); *H05K 9/0084* (2013.01)

(58) Field of Classification Search
CPC .................................................. H05K 9/0026
See application file for complete search history.

(56) References Cited

U.S. PATENT DOCUMENTS

| 4,218,578 | A | 8/1980 | Olschewski |
| 5,083,945 | A | 1/1992 | Miskin |
| (Continued) | | | |

FOREIGN PATENT DOCUMENTS

| KR | 101241857 B1 | 3/2013 |
| WO | WO2008/147698 A1 | 12/2008 |
| WO | WO2010/080447 A1 | 7/2010 |

OTHER PUBLICATIONS

International Search Report for PCT/US2019/051238 dated Jan. 2, 2020.

(Continued)

*Primary Examiner* — Hung V Ngo
(74) *Attorney, Agent, or Firm* — Katterle Nupp LLC; Paul Katterle; Robert Nupp

(57) ABSTRACT

An electromagnetic compatability (EMC) shield and a method of producing the same are disclosed. The EMC shield is for mounting to a substrate having a plurality of holes formed therein, such as a printed circuit board. The EMC shield is formed from a sheet of conductive metal and includes a top wall having opposing side portions. A pair of opposing first side walls are joined to the top wall at first bends, respectively. Each first side wall has a bottom portion with a plurality of mounting contacts extending therefrom. The mounting contacts may have a press-fit construction and are adapted for receipt in the holes of the substrate. The EMC shield further includes a pair of opposing second side walls, each of which is joined by a second bend to one of the first side walls. Each second side wall has a top portion that at least partially adjoins one of the side portions of the top wall.

20 Claims, 8 Drawing Sheets

(56) References Cited

U.S. PATENT DOCUMENTS

| | | | |
|---|---|---|---|
| 5,400,949 A | | 3/1995 | Hirvonen |
| 5,847,938 A | * | 12/1998 | Gammon ............... H05K 9/003 |
| | | | 361/752 |
| 6,235,985 B1 | | 5/2001 | Dai |
| 6,612,868 B2 | | 9/2003 | Hwang |
| 6,666,720 B1 | | 12/2003 | Reisinger |
| 7,368,661 B2 | | 5/2008 | Lalancette |
| 7,926,166 B2 | | 4/2011 | Zuehlsdorf |
| 9,247,682 B2 | | 1/2016 | Watanabe |
| 9,820,416 B2 | | 11/2017 | Miklinski |
| 2007/0051527 A1 | * | 3/2007 | Lalancette ............... H02G 3/08 |
| | | | 174/50 |
| 2008/0245562 A1 | | 10/2008 | Meyer |
| 2017/0172019 A1 | * | 6/2017 | Kurz ................... H05K 9/0049 |
| 2018/0116077 A1 | * | 4/2018 | Chang ................. H05K 1/0218 |
| 2019/0082562 A1 | * | 3/2019 | Mun .................... H05K 9/0028 |

OTHER PUBLICATIONS

Written Opinion of the ISA for PCT/US2019/051238, dated Jan. 2, 2020.

* cited by examiner

EMC SHIELD AND METHOD OF PRODUCING THE SAME

CROSS-REFERENCE TO RELATED APPLICATION(S)

This application is the U.S. national phase of PCT Application No. PCT/US2019/051238 filed on 16 Sep. 2019, which claims the benefit of priority under 35 U.S.C. § 119(e) to U.S. Provisional Patent Application No.: 62/740,537, filed on Oct. 3, 2018, both of the foregoing patent applications being herein incorporated by reference.

TECHNICAL FIELD

The present disclosure relates to an electromagnetic shield and, more particularly, to an electromagnetic shield for mounting to a substrate with holes, such as a printed circuit board.

BACKGROUND

Electromagnetic interference (EMI) is an important issue for electronic devices in terms of performance and conformance to standards and regulations. In an electronic device, some components may be sources of EMI, while the performance of other, nearby components may be adversely affected by EMI. In addition, standards and/or regulations for a particular class of electronic device may have electromagnetic compatibility (EMC) requirements that limit the amount of EMI that can be emitted by the electronic device.

In order to protect sensitive components from EMI and to comply with EMC requirements, EMC shields are often placed around important components of electronic devices. An EMC shield prevents EMI from entering or leaving the EMC shield.

Conventionally, an EMC shield is constructed of one or more sheets of conductive metal, such as copper or steel. Since electronic device components are typically mounted to printed circuit boards (PCBs), an EMC shields is often provided with features for mounting the EMC shield to a PCB. Such mounting features conventionally take the form of pads or pins that are soldered to corresponding pads or holes in the PCB.

With the proliferation of different electronic devices that need EMC shields, it would be desirable to provide an improved EMC shield that can be produced by a process that can be readily modified to make EMC shields of different sizes.

SUMMARY

In accordance with the present disclosure, an electromagnetic compatability (EMC) shield is provided for mounting to a substrate having a plurality of holes formed therein. The EMC shield includes a unitary piece of conductive metal configured to include a top wall, opposing first side walls and opposing second side walls. The top wall has opposing side portions. The first side walls are joined to the top wall at first bends, respectively. Each first side wall has a bottom portion with at least one contact extending therefrom. Each contact is adapted for receipt in one of the holes of the substrate. Each second side wall is joined by a second bend to one of the first side walls. Each second side wall has a top portion that at least partially adjoins one of the side portions of the top wall.

Also provided in accordance with the present disclosure is a method of forming an EMC shield from a conductive metal sheet. In accordance with the method, first and second series of contacts are formed in the metal sheet. The first series of the contacts extend in an opposite direction from the second series of the contacts. A segment of the metal sheet is separated from a remaining segment of the metal sheet. The segment of the metal sheet is configured to form an intermediate piece having a main section and a pair of strip sections. The main section has opposing first side portions and opposing second side portions. One or more of the contacts extend from each of the first side portions. The strip sections extend in opposing directions from the second side portions of the main section, respectively. The intermediate piece is manipulated to form the EMC shield, which comprises a pair of opposing first side walls, a pair of opposing second side walls and a top wall. The second side walls are formed from the strip sections of the intermediate piece and the first side walls and the top wall are formed from the main section of the intermediate piece. The first side walls have bottom portions that are formed from the first side portions of the main section of the intermediate piece, respectively, whereby each of the first side walls has one or more of the contacts extending from its bottom portion.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1:
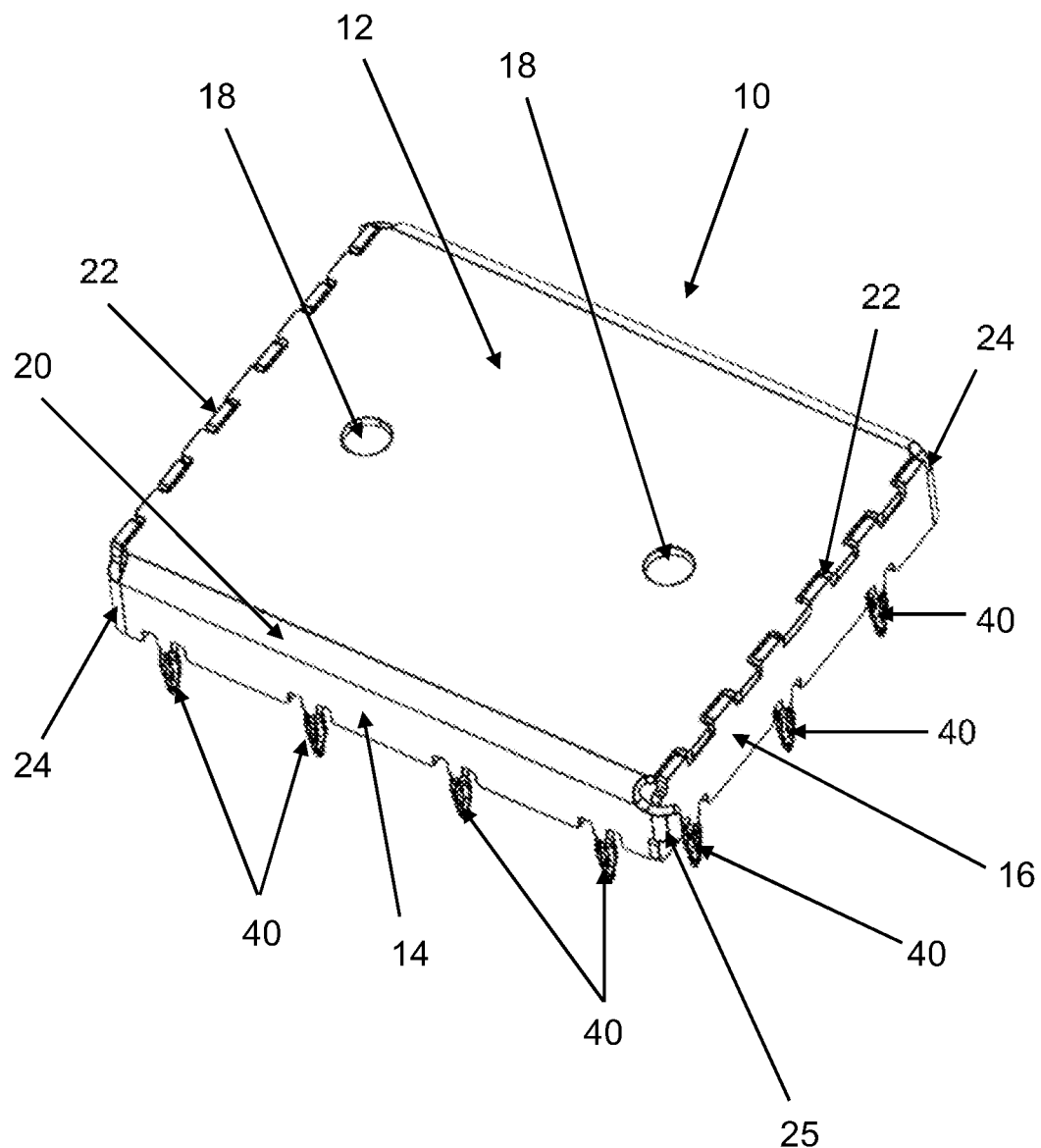
FIG. 1 shows a top perspective view of a first embodiment of an EMC shield of the present disclosure.

It should be noted that in the detailed descriptions that follow, identical components have the same reference numerals, regardless of whether they are shown in different embodiments of the present disclosure. It should also be noted that for purposes of clarity and conciseness, the drawings may not necessarily be to scale and certain features of the disclosure may be shown in somewhat schematic form.

Spatially relative terms, such as "top", "bottom", "lower", "above", "upper", and the like, are used herein merely for ease of description to describe one element or feature's relationship to another element(s) or feature(s) as they are illustrated in (a) drawing figure(s) being referred to. It will be understood that the spatially relative terms are not meant to be limiting and are intended to encompass different orientations of the device in use or operation in addition to the orientation depicted in the drawings.

The present disclosure is directed to an EMC shield and a method of producing the same. An EMC shield 10 constructed in accordance with a first embodiment of the present disclosure is shown in FIGS. 1-5. As will be described more fully below, the EMC shield 10 is constructed from a single piece of conductive metal and, as such, has a unitary or monolithic structure. Examples of conductive metal that may be used include stainless steel, tin plated carbon steel, copper alloys and aluminum. A particularly suitable conductive metal is a copper, nickel, zinc alloy. The EMC shield 10 has a substantially rectangular shape and includes a top wall 12, a pair of opposing first side walls 14 and a pair of opposing second side walls 16. The top wall 12 may have a plurality of openings 18 formed therein to facilitate air flow through the EMC shield 10 to promote cooling of a component enclosed by the EMC shield 10. The openings 18 may also function as locating features when the EMC shield 10 is being mounted to a printed circuit board. The openings 18 may be circular (as shown) or have any other suitable shape. The top wall 12 is joined to the first side walls 14 at main or first bends 20, respectively, which position the first side walls 14 at angles of 90°±5° from the top wall 12, respectively. The top wall 12 is connected to the second side walls 16 by seams 22, respectively, each of which is formed by interlocking pairs of teeth 26, 28. The seams 22 position the second side walls 16 at angles of 90°±5° from the top wall 12, respectively.

Each first side wall 14 and each second side wall 16 has opposing first and second ends. The first end of each first side wall 14 is joined by a second bend 24 to the first end of one of the second side walls 16 and the second end of each first side wall 14 is connected to the second end of the other second side wall 16 by a locking tab 25. The locking tabs 25 are joined to the second ends of the first side walls 14, respectively. The locking tab 25 of each first side wall 14 is bent over the second end of a second side wall 16 to connect the two walls together. In this manner, each second side wall 16 is secured between a pair of the first side walls 14 by a second bend 24 and a bent locking tab 25. The locking tabs 25 help secure together the EMC shield 10 and eliminate air gaps that would otherwise be present at the corners.

Figure 2:
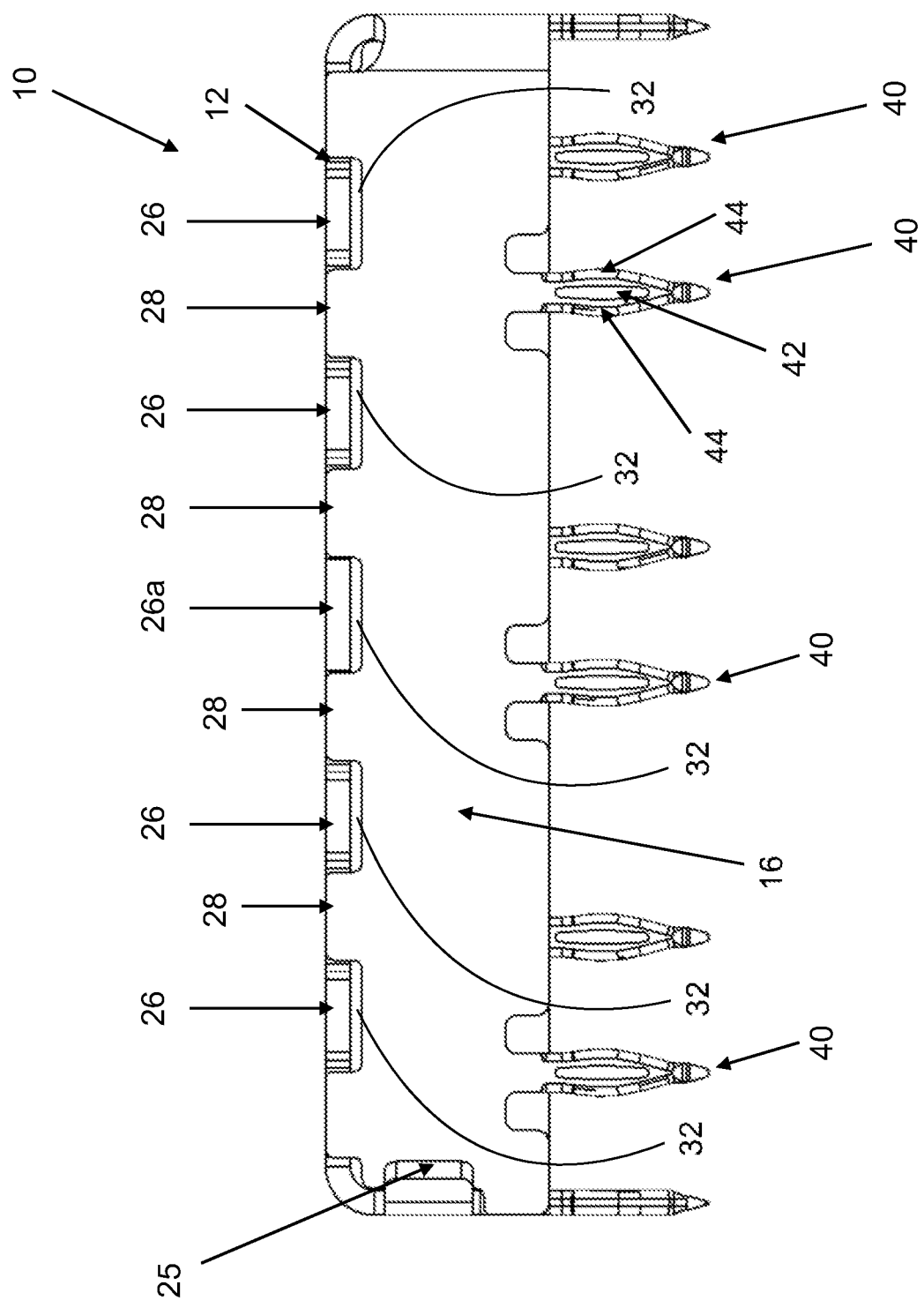
FIG. 2 shows a right side elevational view of the EMC shield shown in FIG. 1.
Figure 3:
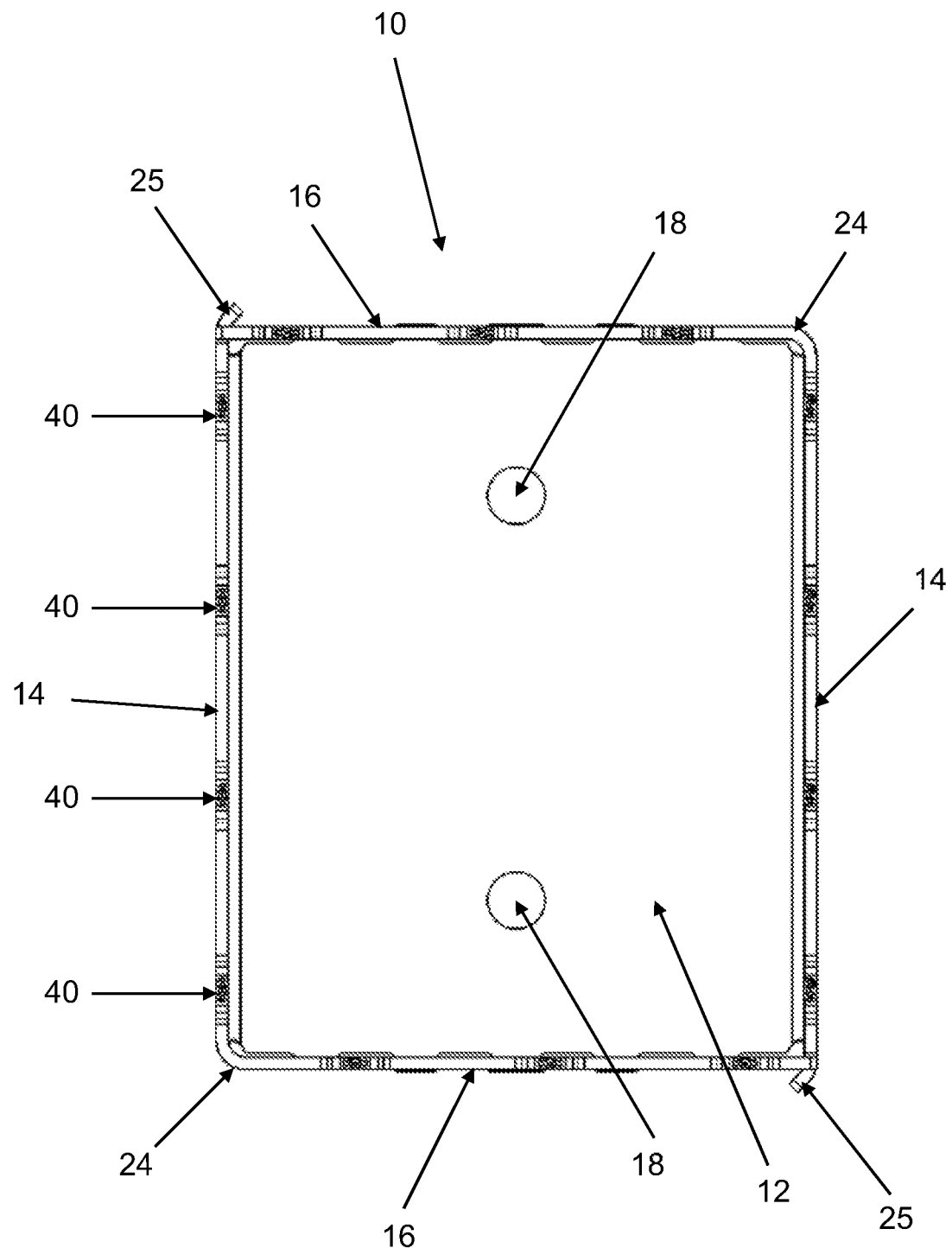
FIG. 3 shows a bottom plan view of the EMC shield of FIG. 1.
Figure 4:
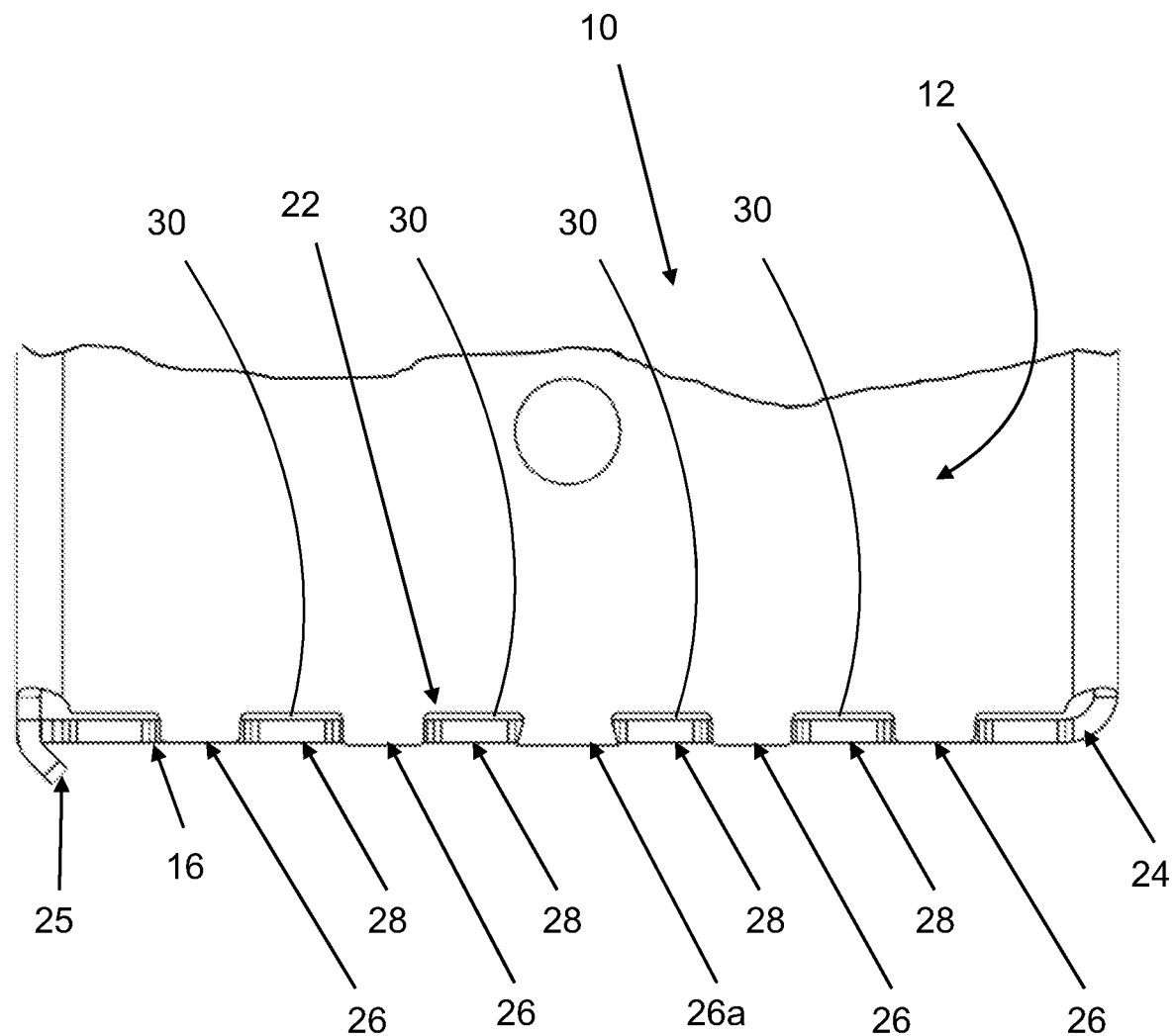
FIG. 4 shows an enlarged top plan view of a portion of the EMC shield of FIG. 1.

As set forth above, the top wall 12 is connected to the second side walls 16 by seams 22, respectively. Each seam 22 is formed by the engagement of teeth 26 formed in a side portion of the top wall 12 with teeth 28 formed in a top portion of a corresponding second side wall 16, as is best shown in FIGS. 2 and 4 to which particular reference is now made. The teeth 26 are separated by gaps or notches 30 within which are disposed the teeth 28, respectively. Similarly, the teeth 28 are separated by gaps or notches 32, within which are disposed the teeth 26, respectively. Each tooth 28 may have the shape of a rectangular tab. Similarly, each tooth 26 may have the shape of a rectangular tab; however, one or more teeth 26a may be wedge-shaped and have a wider outer portion that tapers to a narrower inner portion. In this manner, the inner portion of a tooth 26a is trapped between teeth 28 of one of the second side walls 16. Thus, the teeth 26a help secure the second side walls 16 to the top wall 12.

While in the shown embodiment of the EMC shield 10, each second side wall 16 is connected to the top wall 12 by a seam 22 formed by a plurality of teeth 26 and a plurality of teeth 28, it should be appreciated that in other embodiments, each second side wall 16 may be connected to the top wall 24 by a single notch and tab engagement. For example, each side portion of the top wall 12 may have a single outwardly-extending tab or tooth 26 which is received in a single notch 32 of a top portion of a second side wall 16. Alternately, each second side wall 16 may have a top portion with a single outwardly-extending tab or tooth 28, which is received in a single notch 30 of a side portion of the top wall 12. In still other embodiments, the second side walls 16 may not be directly connected to the top wall 12 by any type of engagement, but may merely be adjacent to or at least partially adjoin the top wall 12.

The first side walls 14 and the second side walls 16 each have a bottom portion with a plurality of mounting contacts 40 extending therefrom. Depending upon the shape of the EMC shield 10, the total number of mounting contacts 40 may vary. In addition, the number of mounting contacts 40 in each first side wall 14 may be the same or different than the number of mounting contacts 40 in each second side wall 16. In the first embodiment shown in FIGS. 1-5, each first side wall 14 has four mounting contacts 40, while each second side wall 16 has three mounting contacts 40. Each mounting contact 40 may have a press-fit construction. More particularly, each mounting contact 40 may have an eye-of-the-needle (EON) type of press-fit construction. With this type of construction, each mounting contact 40 includes a center piercing 42 forming a pair of beams 44 that bow outwardly and are joined at an outer tip and at an inner neck, which is joined to a first side wall 14 or a second side wall 16, as the case may be. Each mounting contact 40 is adapted to be press-fit into a hole in a substrate, such as the plated hole 50 in the printed circuit board (PCB) 52 shown in FIG. 5. As the mounting contact 40 is being press-fit into the PCB hole 50, the beams 44 initially deflect inward and then resiliently move outward to provide a normal force against the PCB hole 50, thereby providing a reliable physical and electrical connection.

The mounting contacts 40 used in the EMC shield 10 are not limited to having an EON-type of press fit construction. Instead, fastening structures having a different press-fit construction may be used, or the fastening structures may simply be elongated pins that are soldered into the holes of a PCB. In still another embodiment, the mounting contacts 40 may have a lower enlarged planar surface that may be soldered to a metal pad of a PCB or an insulated metal substrate, such as a metal core printed circuit board.

Figure 5:
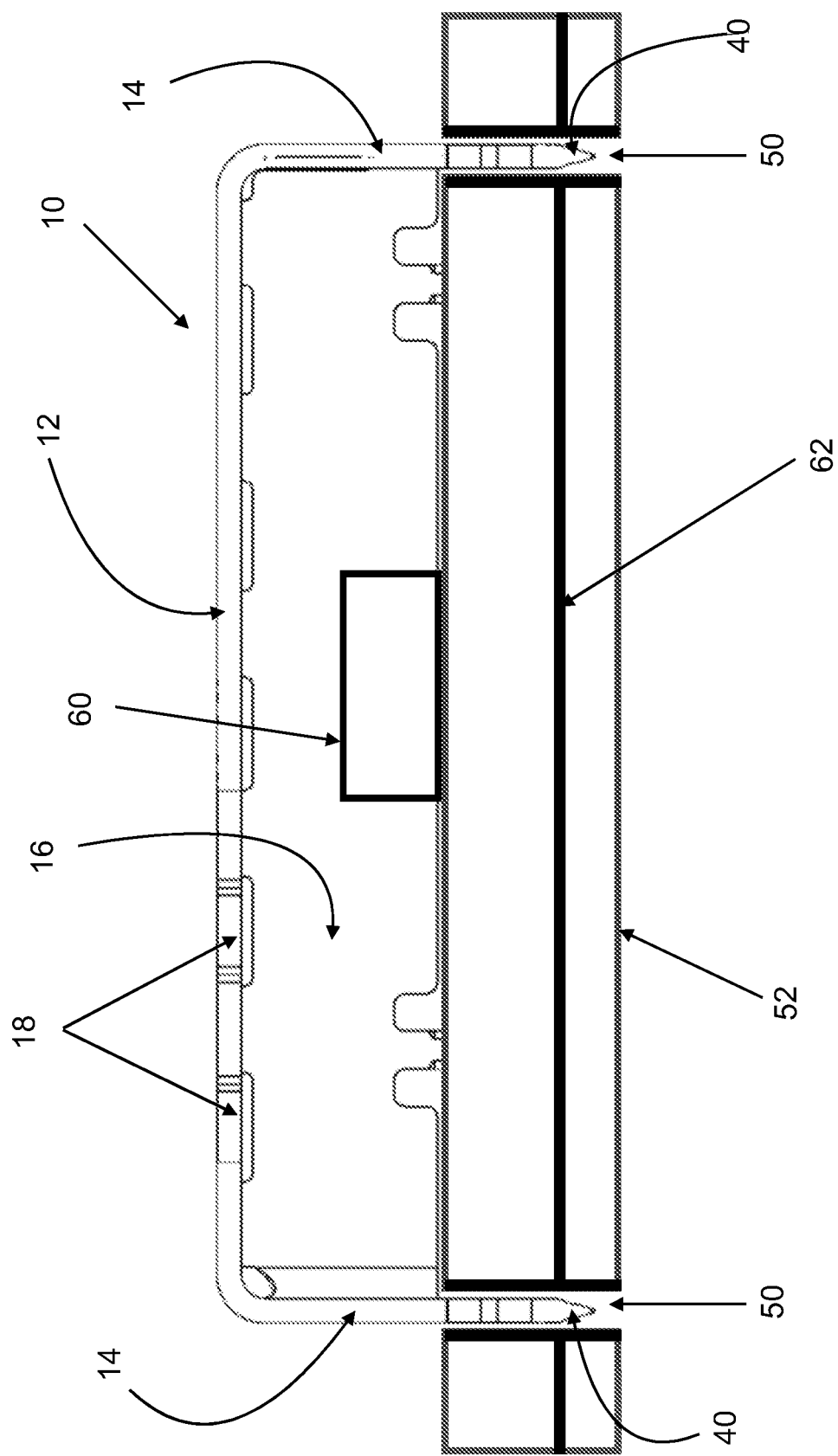
FIG. 5 shows a sectional view of the EMC shield of FIG. 1 mounted to a printed circuit board.

Referring now to FIG. 5, the EMC shield 10 is shown mounted to the PCB 52. The EMC shield 10 encloses an electronic device 60, which is also mounted to the PCB 52. The electronic device 60 may emit EMI or be sensitive to EMI. If the electronic device 60 emits EMI, the EMC shield 10 will substantially prevent the EMI from leaving the EMC shield 10 and escaping to the outside environment, whereas if the electronic device 60 is sensitive to EMI, the EMC shield 10 will substantially prevent EMI from entering the EMC shield 10 and interfering with the operation of the electronic device 60. The EMC shield 10 is mounted to the PCB 52 by the mounting contacts 40, which are press-fit into the holes 50 in the PCB 52. The holes 52 are plated and are electrically connected to a ground plane 62 of the PCB 52. In this manner, the EMC shield 10 is grounded so as to dissipate the EMI that contacts the EMC shield 10.

Figure 6:
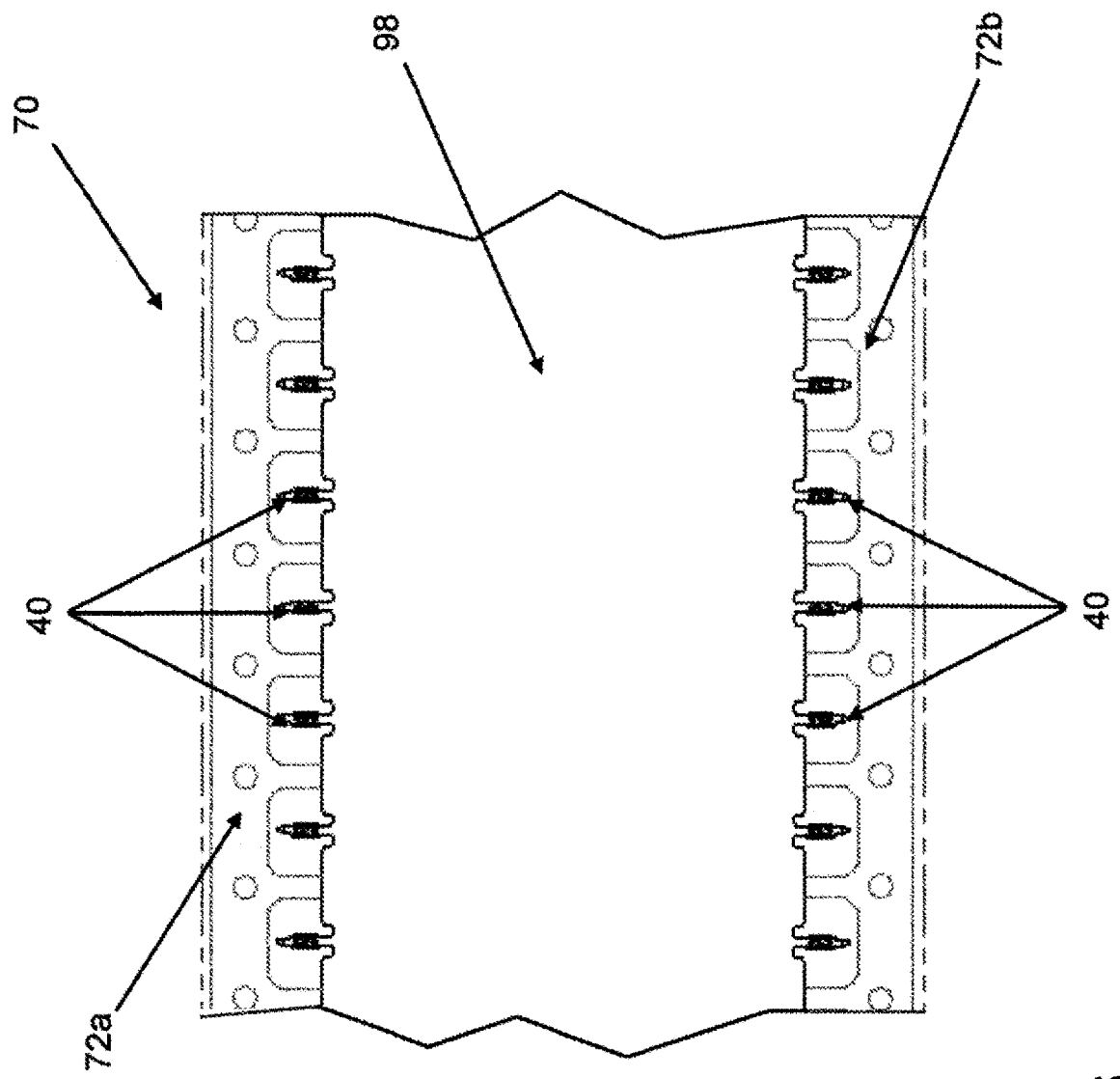
FIG. 6 shows a schematic view of a stamped blank being formed from a sheet of conductive metal.
Figure 7:
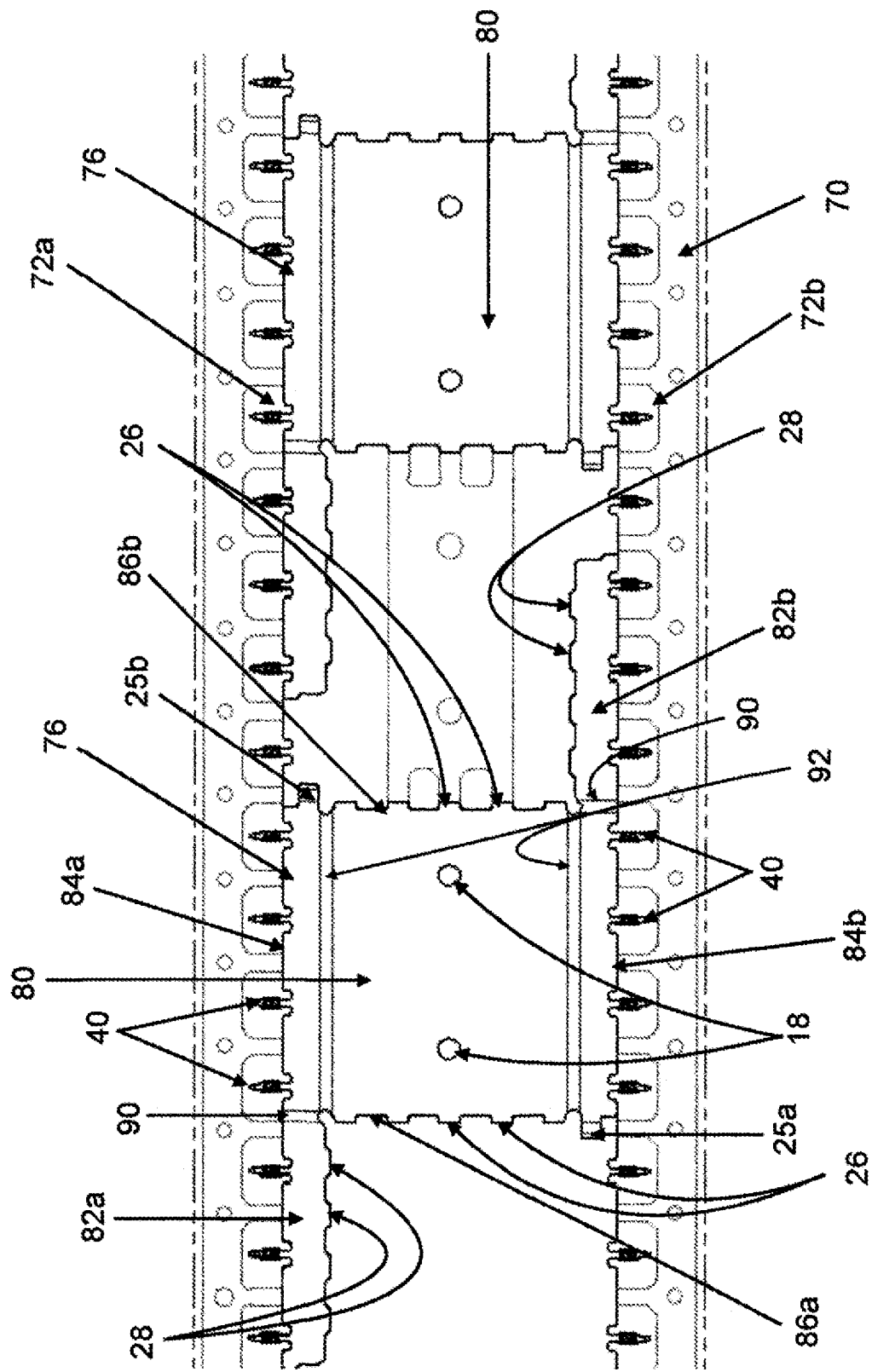
FIG. 7 shows a schematic view of the stamped blank of FIG. 6 being stamped to form a plurality of intermediate pieces that are later manipulated to form EMC shields.

With reference now to FIGS. 6 and 7, the EMC shield 10 may be produced pursuant to a method performed on a sheet 70 of conductive metal, such as stainless steel, a carbon steel, a copper alloy, or aluminum. The sheet 70 may be part of a continuous roll of the conductive metal. In one or more steps, the sheet 70 is stamped to form first and second series 72a,b of the mounting contacts 40 and to produce one or more intermediate pieces 76, which are then manipulated to form one or more EMC shields 10, respectively. The first and second series 72a,b of the contacts 40 extend from opposing sides of the stamped sheet 70 and, thus, extend in opposite directions from each other. When the sheet 70 is stamped to form an intermediate piece 76, the intermediate piece 76 may be separated from the remainder of the sheet 70.

Each intermediate piece 76 is flat and has a main section 80 joined to a pair of strip sections 82a,b. The main section 80 has opposing first side portions 84a,b and opposing second side portions 86a,b. The first side portion 84a comprises contacts 40 from the first series 72a, while the first side portion 84b comprises contacts 40 from the second series 72b. The second side portions 86a,b each include teeth 26. Openings 18 extend through the main section 80.

The strip section 82a extends from the second side portion 86a, while the strip section 82b extends from the second side portion 86b. Mounting contacts 40 from the first series 72a extend from an outer portion of the strip section 82a, while mounting contacts 40 from the second series 72b extend from an outer portion of the strip section 82b. Inner portions of the strip sections 82a,b each include teeth 28.

One of the locking tabs 25 (further designated by the letter "a") is joined to, and extends from, the second side portion 86a of the main section 80. The locking tab 25a is disposed slightly inward from the first side portion 84b of the main section 80. The other one of the locking tabs 25 (further designated by the letter "b") is joined to, and extends from, the second side portion 86b of the main section 80. The locking tab 25b is disposed slightly inward from the first side portion 84a of the main section 80.

After an intermediate piece 76 is formed and separated from the remainder of the sheet 70, the intermediate piece is manipulated to form an EMC shield 10. More specifically a plurality of bends are made in the intermediate piece 76. The second bends 24 may be made first in the intermediate piece 76 at the lines 90, respectively, such that the strip sections 82a,b are disposed at about right angles, respectively, to the main section 80 (so as to extend out of the plane of FIG. 7). The lines 90 are located at the junctures between the main section 80 and the strip sections 82a,b, respectively. After the second bends 24 are made, the first bends 20 may then be made in the intermediate piece 76 along the lines 92, respectively, such that the first bends 20 are each at an angle of about 90° (so that the contacts 40 of the first and second side portions 84a, b extend out of the plane of FIG. 7). The lines 92 are spaced inward from and parallel to the first side portions 84a,b of the main section 80. As the second bends 24 are being completed, the teeth 26 of the main section 80 may be engaged with the teeth 28 of the strip sections 82a,b to form the seams 22, respectively. Finally, the locking tabs 25 may be bent over free ends of the strip sections 82a,b, respectively, thereby completing the formation of an EMC shield 10.

From the foregoing, it should be appreciated that the second side walls 16 are formed from the strip sections 82a,b of the intermediate piece 76 and the first side walls 14 and the top wall 12 are formed from the main section 80 of the intermediate piece 76, with the bottom portions of the first side walls 14 being formed from the first side portions 84a,b of the main section 80.

In the above-described method for producing the EMC shield 10, the formation of the first and second series 72a,b of the contacts 40 in the sheet 70 may be performed in a stamping operation separate from the stamping operation that forms the intermediate piece 76. Alternately, the stamping of the sheet 70 to form the first and second series 72a,b of the contacts 40 may be performed in the same stamping operation as the formation of the intermediate piece 76. In addition, the formation of the intermediate piece 76 may be performed in a single stamping operation or in a series of stamping operations. Still further, a plurality of the intermediate pieces 76 may be formed in a single stamping operation or in a series of stamping operations.

In one embodiment, the sheet 70 may be stamped in a first stamping operation to form a stamped blank 98 having the first and second series 72a,b of the contacts 40. The stamped blank 98 is then further stamped in a series of subsequent stamping operations to form a series of intermediate pieces 76, respectively. In a variation of this embodiment, the stamped blank 98 may be stamped to form different-size intermediate pieces, which, in turn, are manipulated to form different-size EMC shields.

The method for producing the EMC shield 10 may also include a plating operation, such as when the conductive metal is carbon steel. For example, the sheet 70 may be stamped to form the stamped blank 98 having the first and second series 72a,b of the contacts 40, after which the stamped blank 98 may be coated with tin in a plating operation. The tin-coated blank 98 may then be stamped in one or more subsequent stamping operations to form one or more intermediate pieces 76.

Figure 8:
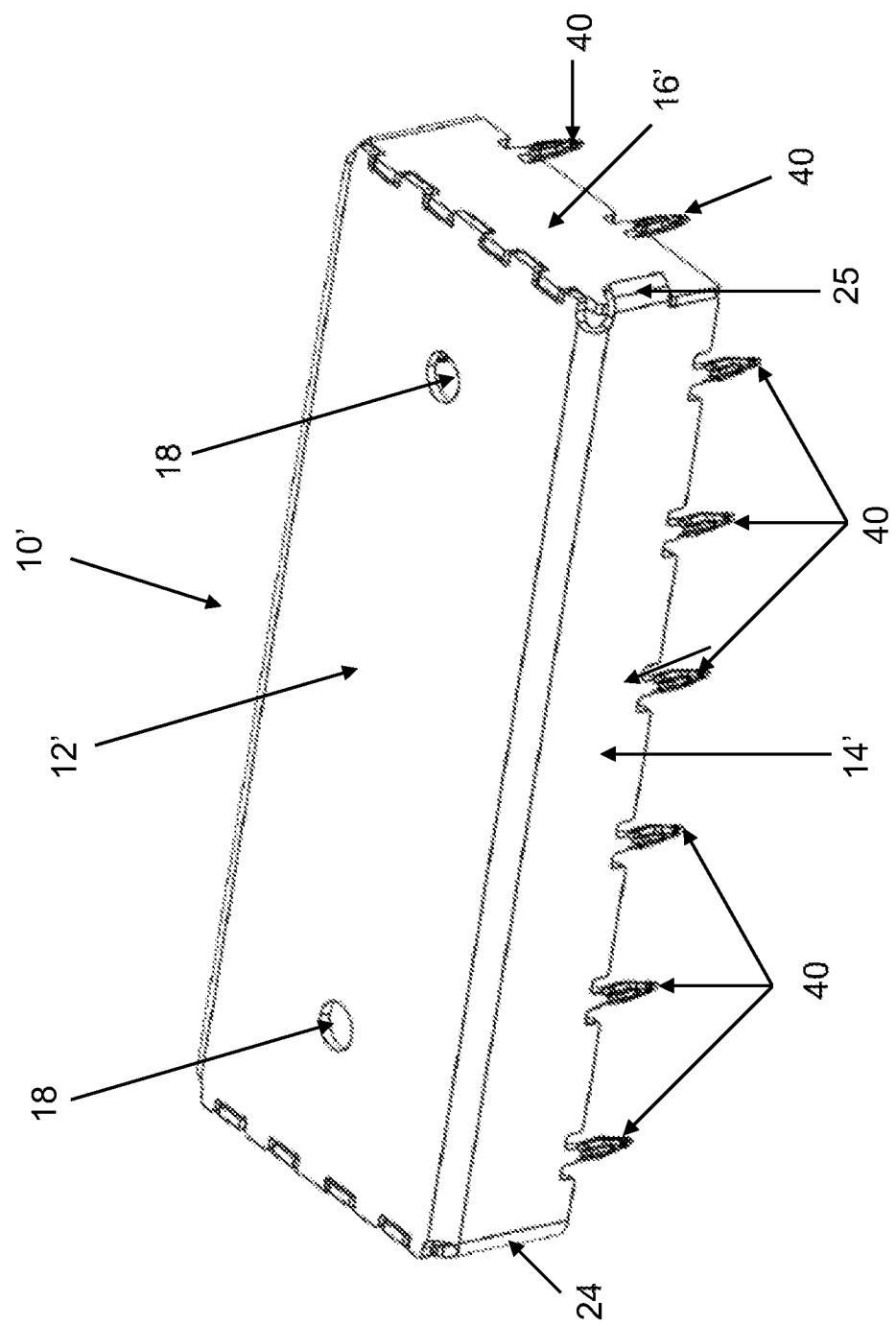
FIG. 8 shows a top perspective view of a second embodiment of an EMC shield of the present disclosure.

The construction of the EMC shield 10 and its method of production provide a number of benefits, such as permitting a completely formed rectangular EMC shield 10 with press-fit contacts 40 on all four sides to be produced in a progressive stamping tool. The locking tabs 25 help the EMC shield 10 meet tight tolerances and help minimize air gaps. Also, different size EMC shields may be produced from a single blank 98. For example, by extending the length of the main section 80 of the intermediate piece 76, shortening the lengths of the strip sections 82a,b and changing the locations of the first bends 20, a different-size EMC shield can be produced, such as the EMC shield 10' shown in FIG. 8, which has the same construction as the EMC shield 10, except as noted below. The top wall 12' of the EMC shield 10' is longer and narrower than the top wall 12 of the EMC shield 10. In addition, the openings 18 in the top wall 12' of the EMC shield 10' are spaced farther apart than the openings 18 in the top wall 12 of the EMC shield 10. Also, the first side walls 14' of the EMC shield 10' are higher, longer and have more mounting contacts 40 than the first side walls 14 of the EMC shield 10. Further, the second side walls 16' of the EMC shield 10' are higher, shorter and have less mounting contacts 40 than the second side walls 16 of the EMC shield 10.

It is to be understood that the description of the foregoing exemplary embodiment(s) is (are) intended to be only illustrative, rather than exhaustive. Those of ordinary skill will be able to make certain additions, deletions, and/or modifications to the embodiment(s) of the disclosed subject matter without departing from the spirit of the disclosure or its scope.

What is claimed is:

1. An electromagnetic compatability (EMC) shield for mounting to a substrate having a plurality of holes formed therein, the EMC shield comprising:
   a unitary piece of conductive metal configured to comprise:
      a top wall having opposing side portions;
      a pair of opposing first side walls joined to the top wall at first bends, respectively, each first side wall having a bottom portion with at least one contact extending therefrom, each contact being adapted for receipt in one of the holes of the substrate;
a pair of opposing second side walls, each of which is joined by a second bend to one of the first side walls, each second side wall having a top portion that at least partially adjoins one of the side portions of the top wall; and
wherein each side portion of the top wall has at least one notch formed therein and the top portions of the second side walls each have at least one tab extending therefrom, and wherein the tabs of the second side walls are disposed in the notches of the top wall, respectively.

2. The EMC shield of claim 1, wherein each side portion of the top wall comprises a plurality of tabs separated by a plurality of notches to thereby form teeth and the top portions of the second side walls each comprise a plurality of tabs separated by a plurality of notches to thereby form teeth, and wherein the teeth of each second side wall are engaged with the teeth of one of the side portions of the top wall.

3. The EMC shield of claim 2, wherein the teeth in each side portion of the top wall comprise at least one tooth that is wedge-shaped and has a wider outer portion that tapers to a narrower inner portion such that the inner portion of the tooth is trapped between teeth of one of the second side walls.

4. The EMC shield of claim 1, wherein the first side walls each have an end with a locking tab joined thereto and the second side walls each have a free end, and wherein the locking tabs of the first side walls are bent over the free ends of the second side walls, respectively, thereby forming rounded corners of the EMC shield.

5. The EMC shield of claim 1, wherein the second side walls each have a bottom portion with at least one contact extending therefrom.

6. The EMC shield of claim 5, wherein the bottom portion of each of the first side walls has a plurality of contacts extending therefrom.

7. The EMC shield of claim 6, wherein the bottom portion of each of the second side walls has a plurality of contacts extending therefrom.

8. The EMC shield of claim 5, wherein each of the contacts of the first and second side walls is configured for press-fit insertion into one of the holes in the substrate and comprises a pair of resiliently movable beams separated by a piercing.

9. The EMC shield of claim 1, wherein the top wall has one or more openings extending therethrough.

10. The EMC shield of claim 1, wherein the conductive metal is selected from the group consisting of stainless steel, tin plated carbon steel, copper alloys and aluminum.

11. The EMC shield of claim 1, wherein the first and second bends are each at about a 90° angle.

12. An electromagnetic compatability (EMC) shield for mounting to a substrate having a plurality of holes formed therein, the EMC shield comprising:
a unitary piece of conductive metal configured to comprise:
a top wall having opposing side portions;
a pair of opposing first side walls joined to the top wall at first bends, respectively, each first side wall having a bottom portion with at least one contact extending therefrom, each contact being adapted for receipt in one of the holes of the substrate;
a pair of opposing second side walls, each of which is joined by a second bend to one of the first side walls, each second side wall having a top portion that at least partially adjoins one of the side portions of the top wall; and
wherein the top portions of the second side walls each have at least one notch formed therein and each side portion of the top wall has at least one tab extending therefrom, and wherein the tabs of the top wall are disposed in the notches of the second side walls, respectively.

13. The EMC shield of claim 12, wherein each of the tabs of the top wall is wedge-shaped and has a wider outer portion that tapers to a narrower inner portion such that the inner portions of the tabs are trapped in the notches of the second side walls.

14. The EMC shield of claim 12, wherein the second side walls each have a bottom portion with a plurality of contacts extending therefrom;
wherein the bottom portion of each of the first side walls has a plurality of contacts extending therefrom; and
wherein each of the contacts of the first and second side walls is configured for press-fit insertion into one of the holes in the substrate and comprises a pair of resiliently movable beams separated by a piercing.

15. The EMC shield of claim 14, wherein each side portion of the top wall comprises a plurality of tabs separated by a plurality of notches to thereby form teeth and the top portions of the second side walls each comprise a plurality of tabs separated by a plurality of notches to thereby form teeth, and wherein the teeth of each second side wall are engaged with the teeth of one of the side portions of the top wall.

16. A method of forming an electromagnetic compatability (EMC) shield from a conductive metal sheet, comprising:
forming first and second series of contacts in the metal sheet, the first series of the contacts extending in an opposite direction from the second series of the contacts;
separating a segment of the metal sheet from a remaining segment of the metal sheet;
configuring the segment of the metal sheet to form an intermediate piece having a main section and a pair of strip sections, the main section having opposing first side portions and opposing second side portions, wherein at least one of the contacts extend from each of the first side portions, and wherein the strip sections extend in opposing directions from the second side portions of the main section, respectively; and
manipulating the intermediate piece to form the EMC shield, which comprises a pair of opposing first side walls, a pair of opposing second side walls and a top wall, wherein the second side walls are formed from the strip sections of the intermediate piece and the first side walls and the top wall are formed from the main section of the intermediate piece, the first side walls having bottom portions that are formed from the first side portions of the main section of the intermediate piece, respectively, whereby each of the first side walls has at least one contact extending from its bottom portion;
wherein the step of manipulating the intermediate piece comprises: making strip bends at the junctures between the main section and the strip sections, respectively, so that the strip sections are disposed at about right angles to the main section, respectively; and making main bends in the main section along lines that are spaced inward from and parallel to the first side portions in the main section, respectively;

wherein the strip bends and the main bends help define the top wall, the first side walls and the second side walls of the EMC shield; and wherein each of the strip sections of the intermediate piece has inner and outer portions, each of the outer portions having at least one of the contacts extending therefrom, and wherein after the steps of making the strip bends and the main bends, the contacts of the strip sections form contacts that extend from bottom portions, respectively, of the second side walls of the EMC shield.

17. The method of claim 16, wherein the steps of separating the segment of the metal sheet and configuring the segment of the metal sheet are performed at the same time in a stamping operation.

18. The method of claim 16, wherein the step of configuring the segment of the metal sheet to form the intermediate piece comprises forming teeth in each of the second side portions of the main section and forming teeth in each of the inner portions of the strip sections;

wherein after the steps of making the strip bends and the main bends, the teeth of the main section form teeth in opposing side portions of the top wall of the EMC shield;

wherein after the steps of making the strip bends and the main bends, the teeth of the strip sections form teeth in top portions of the second side walls of the EMC shield; and wherein the step of manipulating the intermediate piece further comprises engaging the teeth of the top portions of the second side walls with the teeth of the side portions of the top wall, respectively.

19. The method of claim 18, wherein the step of configuring the segment of the metal sheet to form the intermediate piece comprises forming locking tabs that extend in opposing directions from the second side portions of the main section of the intermediate piece, respectively;

wherein after the steps of making the strip bends and the main bends, the locking tabs are joined to ends of the first side walls of the EMC shield; and wherein the step of manipulating the intermediate piece further comprises bending the locking tabs over free ends of the second side walls, respectively.

20. The method of claim 16, wherein the step of configuring the segment of the metal sheet is performed such that a plurality of the contacts extend from each of the first side portions of the intermediate piece;

wherein after the step of manipulating the intermediate piece to form the EMC shield, each of the side walls of the EMC shield has a plurality of contacts extending from its bottom portion; and wherein the step of forming first and second series of contacts is performed such that each contact is configured for press-fit insertion into a hole of a substrate and comprises a pair of resiliently movable beams separated by a piercing.

* * * * *